United States Patent
Anthony et al.

(10) Patent No.: US 6,911,685 B2
(45) Date of Patent: Jun. 28, 2005

(54) THERMALLY-ASSISTED MAGNETIC MEMORY STRUCTURES

(75) Inventors: Thomas C. Anthony, Sunnyvale, CA (US); Man K. Bhattacharyya, Cupertino, CA (US); Robert G. Wolmsley, Palo Alto, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/683,326

(22) Filed: Oct. 10, 2003

(65) Prior Publication Data

US 2005/0077556 A1 Apr. 14, 2005

(51) Int. Cl.[7] ............................................. H01L 29/76
(52) U.S. Cl. .................. 257/295; 257/298; 257/303; 257/306; 257/324; 438/3; 438/240
(58) Field of Search ................. 257/68, 71, 295–314, 257/324–326; 438/3, 240

(56) References Cited

U.S. PATENT DOCUMENTS

| 6,385,082 | B1 |   | 5/2002  | Abraham et al. |
| 6,404,674 | B1 | * | 6/2002  | Anthony et al. ............ 365/173 |
| 6,577,549 | B1 |   | 6/2003  | Tran et al. |
| 6,603,678 | B2 |   | 8/2003  | Nickel et al. |
| 6,661,688 | B2 | * | 12/2003 | Bloomquist et al. .......... 365/63 |

* cited by examiner

*Primary Examiner*—Andy Huynh (57) ABSTRACT

An exemplary thermally-assisted magnetic memory structure comprises a first conductor substantially surrounded by a cladding, a memory cell being thermally isolated from the first conductor by a thermally resistive region, and a second conductor electrically contacting the memory cell.

29 Claims, 12 Drawing Sheets

THERMALLY-ASSISTED MAGNETIC MEMORY STRUCTURES

BACKGROUND

A memory chip generally comprises a plurality of memory cells that are deposited onto a silicon wafer and addressable via an array of column conducting leads (bit lines) and row conducting leads (word lines). Typically, a memory cell is situated at the intersection of a bit line and a word line. The memory cells are controlled by specialized circuits that perform functions such as identifying rows and columns from which data are read or to which data are written. Each memory cell can store data in the form of a "1" or a "0," representing a bit of data.

An array of magnetic memory cells can be referred to as a magnetic random access memory or MRAM. MRAM is generally nonvolatile memory (i.e., a solid state chip that retains data when power is turned off). At least one type of magnetic memory cell includes a data layer and a reference layer, separated from each other by at least one intermediate layer. The data layer may also be referred to as a bit layer, a storage layer, or a sense layer. In a magnetic memory cell, a bit of data (e.g., a "1" or "0") may be stored by "writing" into the data layer via one or more conducting leads (e.g., a bit line and a word line). A typical data layer can include one or more ferromagnetic materials. The write operation is typically accomplished via a write current that sets the orientation of the magnetic moment in the data layer to a predetermined direction.

Once written, the stored bit of data may be read by providing a read current through one or more conducting leads (e.g., a read line) to the magnetic memory cell. For each memory cell, the orientations of the magnetic moments of the data layer and the reference layer are either parallel (in the same direction) or anti-parallel (in different directions) to each other. The degree of parallelism affects the resistance of the cell, and this resistance can be determined by sensing (e.g., via a sense amplifier) an output current or voltage produced by the memory cell in response to the read current.

More specifically, if the magnetic moments are parallel, the resistance determined based on the output current is of a first relative value (e.g., relatively low). If the magnetic moments are anti-parallel, the resistance determined is of a second relative value (e.g., relatively high). The relative values of the two states (i.e., parallel and anti-parallel) are typically different enough to be sensed distinctly. A "1" or a "0" may be assigned to the respective relative resistance values depending on design specification.

The intermediate layer, which may also be referred to as a spacer layer, may comprise insulating material (e.g., dielectric), non-magnetic conducting material, and/or other known materials, and is usually thick enough to prevent exchange coupling between the data and reference layers. The various conducting leads which are used to address the memory cells (e.g., bit lines, word lines, and read lines), and to provide currents to pass through the data and reference layers to read data from or write data to the memory cells, are provided by one or more additional layers, called conducting layer(s).

The layers described above and their respective characteristics are typical of magnetic memory cells based on tunneling magnetoresistance (TMR) effects known in the art. Other combinations of layers and characteristics may also be used to make magnetic memory cells based on TMR effects. See, for example, U.S. Pat. No. 6,404,674, issued to Anthony et al., which is hereby incorporated by reference in its entirety for all purposes.

Still other configurations of magnetic memory cells are based on other well known physical effects (e.g., giant magnetoresistance (GMR), anisotropic magnetoresistance (AMR), colossal magnetoresistance (CMR), and/or other physical effects).

Throughout this application, various exemplary embodiments will be described in reference to the TMR memory cells as first described above. Those skilled in the art will readily appreciate that the exemplary embodiments may also be implemented with other types of magnetic memory cells known in the art (e.g., other types of TMR memory cells, GMR memory cells, AMR memory cells, CMR memory cells, etc.) according to the requirements of a particular implementation.

Conventional MRAM as described above generally has the magnetic memory cell situated at the intersection of a pair of orthogonal metal conductors (e.g., made of Cu or Al). In this arrangement, the magnetic memory cells are in good thermal contact with the conductors. Such good thermal contact keeps the temperature of the magnetic memory cells low because heat generated in the magnetic memory cells is rapidly dissipated through the conductors. However, if one desires to elevate the temperature of the magnetic memory cells, the good thermal contact becomes a disadvantage. This is the case in thermally-assisted MRAM, where temperature of a selected magnetic memory cell is elevated during a write operation to facilitate switching of its magnetic orientation.

Thus, a market exists for improved thermally-assisted magnetic memory structures that have reduced thermal contact with the conductors.

SUMMARY

An exemplary thermally-assisted magnetic memory structure comprises a first conductor substantially surrounded by a cladding, a memory cell being thermally isolated from the first conductor by a thermally resistive region, and a second conductor electrically contacting the memory cell. An exemplary method for making a thermally-assisted magnetic memory structure comprises forming a first conductor substantially surrounded by a cladding, forming a second conductor, and forming a memory cell that electrically contacts the second conductor and is thermally isolated from the first conductor by a thermally resistive region.

Other embodiments and implementations are also described below.

DETAILED DESCRIPTION

I. Overview

Exemplary improved thermally-assisted magnetic memory structures and exemplary manufacturing processes for making the improved thermally-assisted magnetic memory structures are described herein.

Section II describes an exemplary thermally-assisted magnetic memory structure.

Section III describes another exemplary thermally-assisted magnetic memory structure.

Section IV describes an exemplary process for making the exemplary thermally-assisted magnetic memory structure of Section II.

Section V describes an exemplary process for making the exemplary thermally-assisted magnetic memory structure of Section III.

Section VI describes an exemplary process for creating a thermally resistive region in the, exemplary magnetic memory structures. This process may be used in combination with processes described in Sections IV and V above.

II. A First Exemplary Thermally-Assisted Magnetic Memory Structure

Figure 1A:
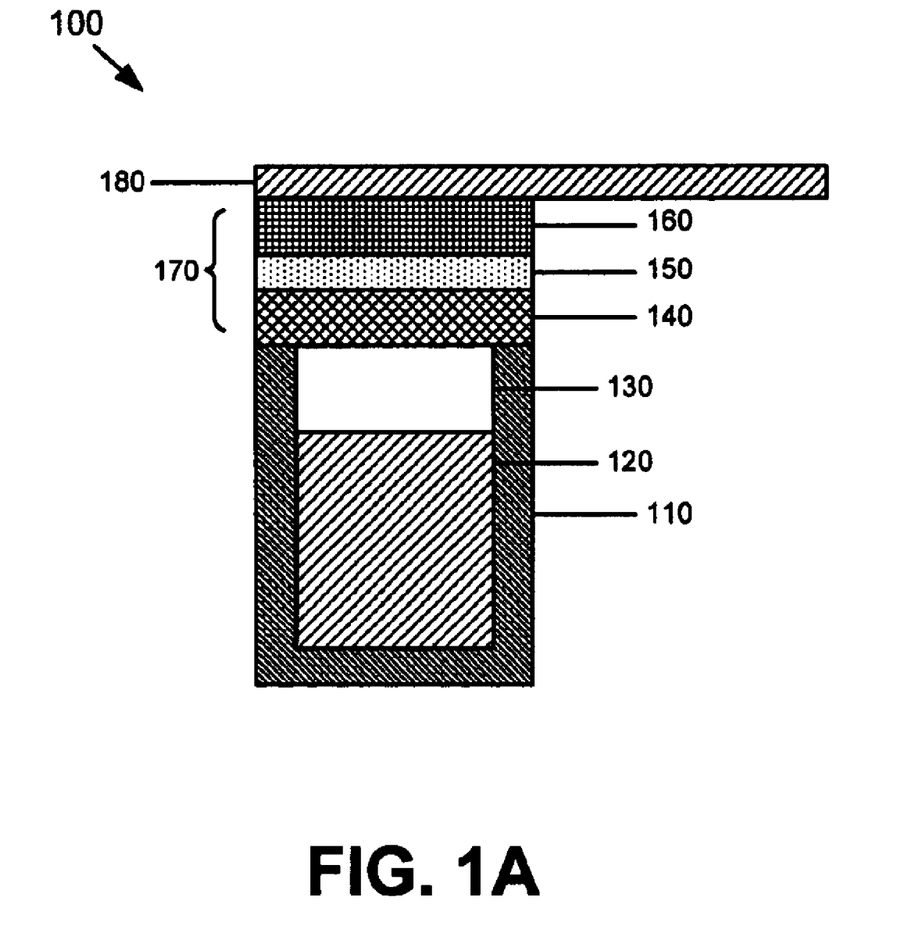
FIG. 1A illustrates the elevation view of an exemplary thermally-assisted magnetic memory structure.

A. An Exemplary Elevation View of the First Exemplary Thermally-Assisted Magnetic Memory Structure FIG. 1A illustrates an elevation view of an exemplary thermally-assisted magnetic memory structure 100. Generally, a memory structure may be made as top-pinned (where the reference layer is on top of the data layer) or bottom-pinned (where the reference layer is below the data layer). For ease of explanation, only the top-pinned configuration is shown in FIG. 1A and referenced in the description of various exemplary embodiments herein. One skilled in the art would readily appreciate that other configurations (e.g., bottom-pinned, etc.) may also be implemented using the exemplary processes disclosed herein in accordance with any particular design requirement.

The memory structure 100 includes a cladding 110, a first conductor 120, a thermally resistive region 130, a data layer 140, a spacer layer 150, a reference layer 160, and a second conductor 180. For ease of explanation, the combination of the data layer 140, the spacer layer 150, and the reference layer 160 may also be referred to as a memory cell 170.

In the exemplary configuration illustrated in FIG. 1A, the first conductor 120 and the second conductor 180 are orthogonal to each other and are collectively used for both write and read operations. In an exemplary implementation, the second conductor 180 may also be used as a heat line to provide heat to a selected memory cell, or a plurality of memory cells, during a write operation.

Other structures known in the art for providing heat to magnetic memory structures during write operations may be implemented in accordance with design choice. See for example, configurations disclosed in U.S. Pat. No. 6,603,678 B2, entitled "Thermally-Assisted Switching of Magnetic Memory Elements," issued to Nickel et al., which is hereby incorporated by reference for all purposes.

In addition, memory structure configurations having additional layers are also known in the art and may be implemented with various embodiments to be described herein in accordance with a particular design choice. For example, another magnetic memory structure configuration may also include a seed layer, an antiferromagnetic (AFM) layer, a protective cap layer, and/or other layers. The seed layer enhances crystalline alignment within the AFM layer. Exemplary materials for a seed layer include Ta, Ru, NiFe, Cu, or combinations of these materials. The AFM layer enhances magnetic stability in the reference layer 160. Exemplary materials for an AFM layer include IrMn, FeMn, NiMn, PtMn, and/or other well known materials. The protective cap layer protects the data layer 140 from the environment (e.g., by reducing oxidation of the data layer 140) and may be formed using any suitable material known in the art. Exemplary materials for a protective cap layer include Ta, TaN, Cr, Al, Ti, and/or still other materials. For ease of explanation, these additional layers are not shown in the Figures.

The first and second conductors 120, 180 may be made of Cu, Al, AlCu, Ta, W, Au, Ag, alloys of one or more of the above, and/or other conducting material(s) and alloy(s). The first and second conductors 120, 180 can be made of the same or different material(s). In an exemplary implementation, the second conductor 180 is thinner (or otherwise forms a smaller heat sink) than the first conductor 120; thus, less heat dissipation results from contact with the second conductor 180. In another exemplary implementation, the second conductor 180 may not be thinner than the first conductor 120 but may comprise one or more materials having a lower thermal conductance than the material(s) of the first conductor 120; thus, less heat dissipation results from contact with the second conductor 180. Even so, the various thermal isolation embodiments discussed herein may nevertheless be applied to the second conductor 180, or still other conductors near the memory cell 170, depending on design choice.

The cladding 110 may comprise one or more materials configured to provide low thermal conductance and electrical contact between the memory cell 170 and the first conductor 120. Low thermal conductance can be achieved by reducing the cross-sectional area of the portion of the cladding 110 electrically connecting the conductor 120 and the memory cell 170. Choice of one or more low thermal conductivity materials for the cladding 110 may also reduce the thermal conductance. For example, the cladding 110 may comprise amorphous metals, doped semiconductors, and/or ferromagnetic materials or alloys. In an exemplary embodiment, ferromagnetic materials suitable for the cladding 110 could include, without limitation, NiFe, NiFeCo, CoFe, $CrO_2$ amorphous ferromagnetic alloys, (e.g., CoZrNb and CoFeB), and other materials.

In an exemplary implementation, the cladding 110 substantially surrounds the first conductor 120 and makes electrical contact with the memory cell 170 to provide switching magnetic fields during write operations. In an exemplary implementation, the cladding 110 substantially surrounds three sides of the first conductor 120. The cladding 110 (e.g., when made of one or more ferromagnetic materials) may also act as a flux guide. When acting as a flux guide, the cladding 110 should be thick enough to not saturate during write operations. At the same time, the cladding 110 should be thin enough to minimize heat dissipation from the memory cell 170. In an exemplary implementation, the cross-sectional area of the contact between the cladding 110 and the memory cell 170 is on the order of 20% or less of the surface area of a layer of the memory cell 170. The memory cell 170 does not have to make electrical contact with all sides of the cladding 110. For example, the memory cell 170 can make contact with just one side of the cladding 110.

The thermally resistive region 130 may contain one or more insulators, air, or a vacuum. The thermally resistive region 130 generally provides a thermally resistive path between the first conductor 120 and the memory cell 170. As a result, when thermal energy is supplied to the memory cell 170 during a write operation (e.g., by a voltage pulse provided to the selected memory cell), the thermal energy is retained within the memory cell volume and substantially elevates the temperature of the memory cell rather than being prematurely dissipated by the first conductor 120. Increasing the temperature of the memory cell, and more specifically, of the data layer 140 within the memory cell, reduces the coercivity of the data layer, thereby facilitating writing data to the memory cell. The thermally resistive region 130 should be as wide as possible to minimize the thermal conductivity path between the first conductor 120 and the memory cell 170. In an exemplary implementation, where the thermally resistive region 130 comprises an insulator, the depth of the region 130 should be large enough to reduce thermal communication between the first conductor 120 and the memory cell 170. In another exemplary implementation, where the thermally resistive region 130 comprises air or is a vacuum, the depth of the region 130 can be small or large depending on design choice.

The data layer 140 may comprise one or more ferromagnetic materials. In an exemplary embodiment, ferromagnetic materials suitable for the data layer 140 include, without limitation, NiFe, NiFeCo, CoFe, CrO2, Fe3O4, amorphous ferromagnetic alloys (e.g., CoZrNb and CoFeB), and other materials.

In an exemplary embodiment, the spacer layer 150 is a tunnel barrier layer (e.g., if the memory cell 170 is a TMR memory cell). In this embodiment, the spacer layer 150 may be made of $SiO_2$, $SiN_x$, MgO, $Al_2O_3$, $AlN_x$, $TaO_x$, and/or other insulating materials.

In another exemplary embodiment, the spacer layer 150 is a non-magnetic conducting layer (e.g., if the memory cell 170 is a GMR memory cell). In this embodiment, the spacer layer 150 may be made of Cu, Au, Ag, and/or other nonmagnetic conducting materials.

The reference layer 160 may comprise a single layer of material or multiple layers of materials. For example, the reference layer 160 may comprise one or more ferromagnetic materials. In an exemplary embodiment, ferromagnetic materials suitable for the reference layer 160 include NiFe, NiFeCo, CoFe, CrO2, Fe3O4, , amorphous ferromagnetic alloys (e.g., CoZrNb and CoFeB), , and other materials.

An exemplary process for making the exemplary memory structure 100 will be described in Section IV below.

Figure 1B:
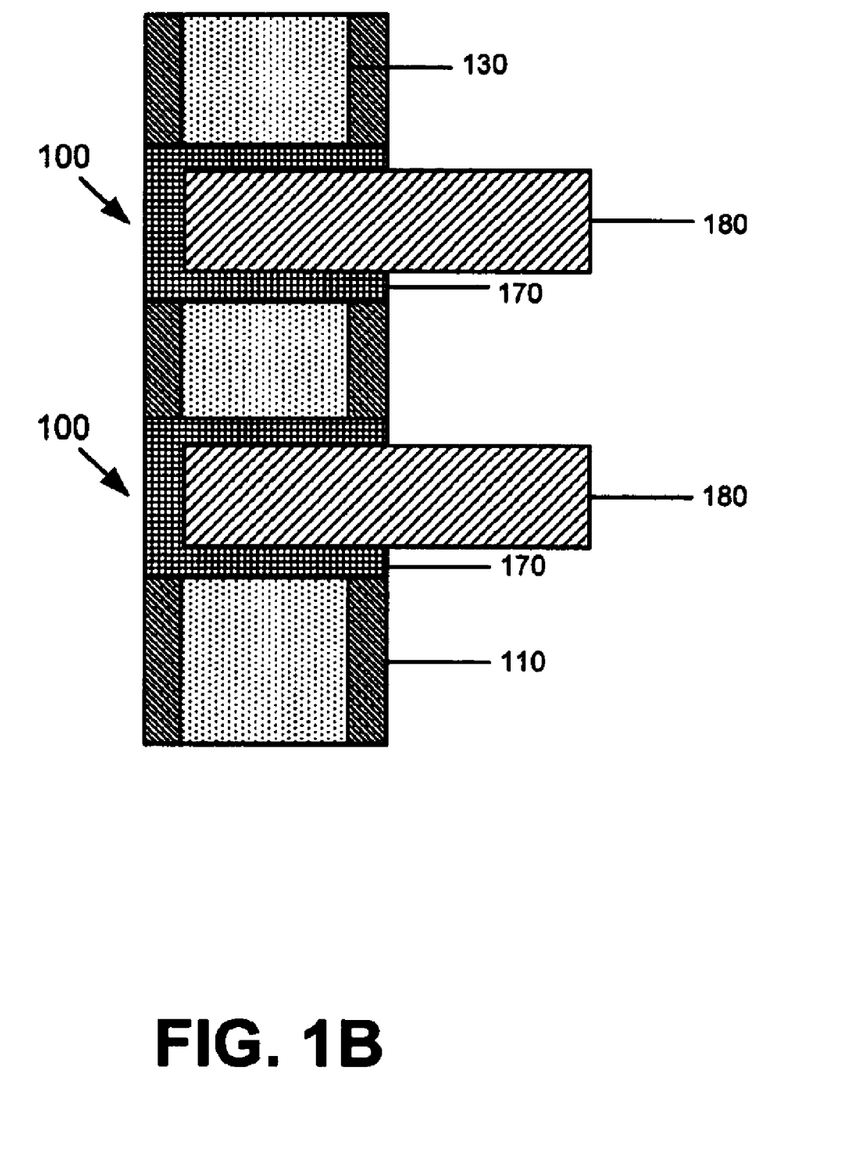
FIG. 1B illustrates the plan view of an array of the exemplary thermally-assisted magnetic memory structure of FIG. 1A.

B. An Exemplary Plan View of an Exemplary Array of the First Thermally-Assisted Magnetic Memory Structure FIG. 1B illustrates a plan view of an exemplary array of the thermally-assisted magnetic memory structure 100 of FIG 1A. Each exemplary memory structure 100 includes a memory cell 170 (which includes a data layer 140 (hidden from view), a spacer layer 150 (hidden from view), and a reference layer 160), a thermally resistive region 130 (which may comprise air, a vacuum, an insulator, or a combination thereof), a first conductor 120 (hidden from view) cladded by the cladding 110 along a first axis, and a second conductor 180 along another axis orthogonal to the axis of the first conductor 120. In another exemplary implementation (not shown), the cladding 110 may be covered by the spacer layer 150 and will be hidden from view.

III. A Second Exemplary Thermally-Assisted Magnetic Memory Structure

A. An Exemplary Elevation View of the Second Exemplary Thermally-Assisted Magnetic Memory Structure FIG. 2A illustrates an elevation view of another exemplary thermally-assisted magnetic memory structure 200.

Figure 2A:
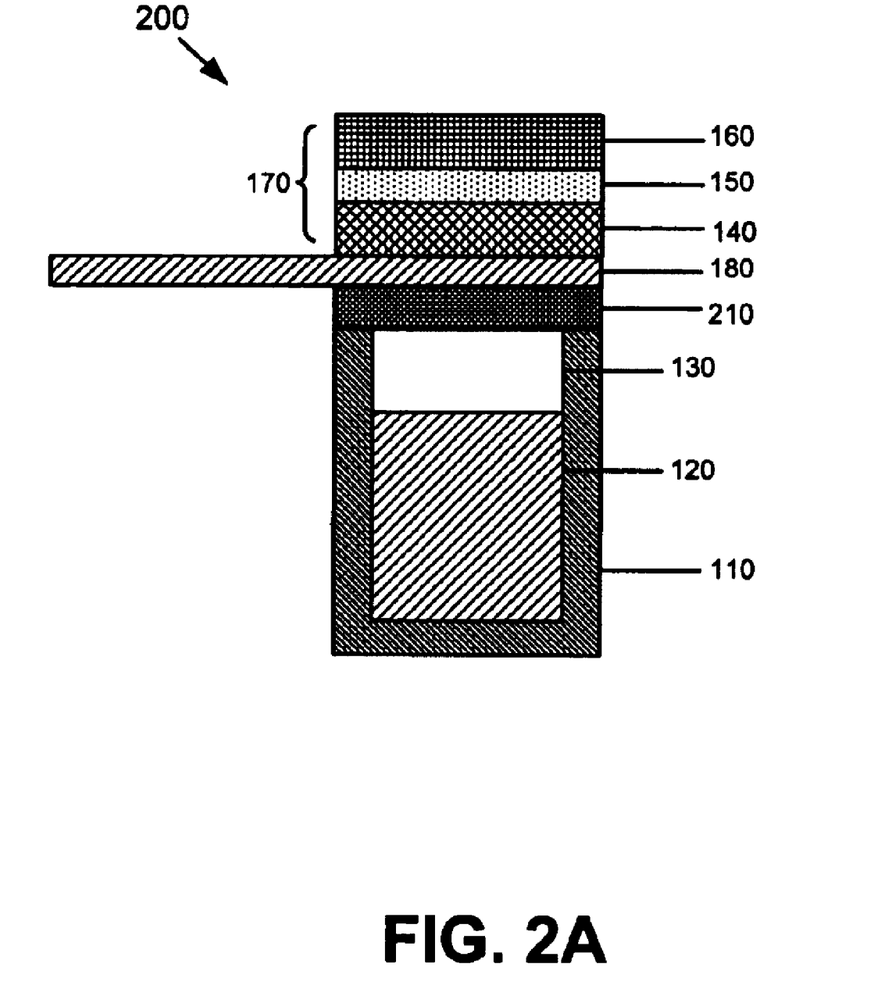
FIG. 2A illustrates the elevation view of another exemplary thermally-assisted magnetic memory structure.

For ease of explanation, only the top-pinned configuration is shown in FIG. 2A and referenced in the description of various exemplary embodiments herein. However, this configuration is merely illustrative. Thus, one skilled in the art would readily appreciate that other configurations (e.g., bottom-pinned, etc.) may also be implemented using the exemplary processes disclosed herein in accordance with any particular design requirement.

The memory structure 200 includes a cladding 110, a first conductor 120, a thermally resistive region 130, an insulating layer 210, a second conductor 180, a data layer 140, a spacer layer 150, and a reference layer 160. For ease of explanation, the combination of the data layer 140, the spacer layer 150, and the reference layer 160 may also be referred to as a memory cell 170.

In this exemplary implementation, additional thermal isolation is provided by the insulating layer 210 when electrical contact between the memory cell 170 and the first conductor 120 is not needed. One skilled in the art will recognize that the memory structure configuration as illustrated in FIG. 2A is merely illustrative. For example, additional conductors can be implemented near the magnetic memory structure 200. In such an exemplary implementation, an additional write conductor (not shown) orthogonal to the first conductor 120 may be added on top of the reference layer 160. This additional write conductor may also be thermally isolated from the memory cell 170 by another thermally resistive region (not shown) and may also be substantially surrounded by another cladding (not shown), where the cladding provides the electrical contact to the memory cell 170. This implementation can be visualized by imagining an upside-down structure of 110, 120, and 130 as shown FIG. 2A on top of the memory cell 170.

In the exemplary configuration illustrated in FIG. 2A, the first conductor 120 and the second conductor 180 are orthogonal to each other. These conductors 120, 180 in combination with additional conductors (not shown) and may be collectively used for both write and read operations. In an exemplary implementation, the second conductor 180 may also be used as a heat line to provide heat to a selected memory cell, or plurality of memory cells, during a write operation.

Other configurations, for example, configurations having other structures for providing heat to magnetic memory cells during write operations may be implemented in accordance with design choice. Further, configurations having additional layers are also known in the prior art. For ease of explanation, these additional layers are not shown in the Figures; however, magnetic memory structures having one or more additional layers may be implemented with various embodiments described herein in accordance with a particular design choice.

The first and second conductors 120, 180 maybe made of Cu, Al, AlCu, Ta, W, Au, Ag, alloys of one or more of the above, and/or other conducting material(s) and alloy(s). The first and second conductors 120, 180 can be made of the same or different material(s). In an exemplary implementation, the second conductor 180 is thinner (or otherwise forms a smaller heat sink) than the first conductor 120; thus, less heat dissipation results from contact with the second conductor 180. In another exemplary implementation, the second conductor 180 may not be thinner than the first conductor 120 but may comprise one or more materials having a lower thermal conductance than the material(s) of the first conductor 120; thus, less heat dissipation results from contact with the second conductor 180. Even so, the various thermal isolation embodiments discussed herein may nevertheless be applied to the second conductor 180, or still other conductors near the memory cell 170, depending on design choice.

The cladding 110 may comprise one or more materials configured to provide low thermal conductance and electrical contact between the memory cell 170 and the first conductor 120. Low thermal conductance can be achieved by reducing the cross-sectional area of the portion of the cladding 110 electrically connecting the conductor 120 and the memory cell 170. Choice of one or more low thermal conductivity materials for the cladding 110 may also reduce the thermal conductance. For example, the cladding 110 may comprise amorphous metals, doped semiconductors, and/or ferromagnetic materials or alloys. In an exemplary embodiment, ferromagnetic materials suitable for the cladding 110 could include, without limitation, NiFe, NiFeCo, CoFe, $CrO_2$, amorphous ferromagnetic alloys, (e.g., CoZrNb and CoFeB), and other materials.

In an exemplary implementation, the cladding 110 (e.g., when made of one or more ferromagnetic materials) may act as a flux guide. That is, the cladding 110 may capture the magnetic fields generated by currents running through the first conductor 120, thereby improving the efficiency of write operations by lowering currents required to create the desired switching magnetic fields. When acting as a flux guide, the cladding 110 should be thick enough to not saturate during write operations.

The thermally resistive region 130 may contain one or more insulators, air, or a vacuum. The thermally resistive region 130 generally provides a thermally resistive path between the first conductor 120 and the memory cell 170. As a result, when thermal energy is supplied to the memory cell 170 during a write operation (e.g., by a voltage pulse provided to the selected memory cell), the thermal energy is retained within the memory cell volume and elevates the temperature of the memory cell rather than being prematurely dissipated by the first conductor 120. Increasing the temperature of the memory cell, and more specifically, of the data layer 140 within the memory cell, reduces the coercivity of the data layer, thereby facilitating writing data to the memory cell. The thermally resistive region 130 should be as wide as possible to minimize the thermal conductivity path between the first conductor 120 and the memory cell 170. In an exemplary implementation, where the thermally resistive region 130 comprises an insulator, the depth of the region 130 should be large enough to reduce thermal communication between first conductor 120 and memory cell 170. In another exemplary implementation, where the thermally resistive region 130 comprises air or is a vacuum, the depth of the region 130 can be small or large depending on design choice.

The insulating layer 210 provides additional thermal isolation of the memory cell 170 from the first conductor 120 and the cladding 110. The insulating layer 210 may be made of $SiO_2$, $SiN_x$, MgO, $Al_2O_3$, $AlN_x$, $TaO_x$, and/or other insulating materials.

A more generalized version of the specific configuration shown here would include 2 or more insulators between at least one of the conductors 120, 180 and the memory cell 170.

The data layer 140 may comprise one or more ferromagnetic materials. In an exemplary embodiment, ferromagnetic materials suitable for the data layer 140 include, without limitation, NiFe, NiFeCo, CoFe,,CrO2, Fe3O4,, amorphous ferromagnetic alloys (e.g., CoZrNb and CoFeB),, and other materials.

In an exemplary embodiment, the spacer layer 150 is a tunnel barrier layer (e.g., if the memory cell 170 is a TMR memory cell). In this embodiment, the spacer layer 150 may be made of $SiO_2$, $SiN_x$, MgO, $Al_2O_3$, $AlN_x$, $TaO_x$, and/or other insulating materials.

In another exemplary embodiment, the spacer layer 150 is a non-magnetic conducting layer (e.g., if the memory cell 170 is a GMR memory cell). In this embodiment, the spacer layer 150 may be made of Cu, Au, Ag, and/or other non-magnetic conducting materials.

The reference layer 160 may comprise a single layer of material or multiple layers of materials. For example, the reference layer 160 may comprise one or more ferromagnetic materials. In an exemplary embodiment, ferromagnetic materials suitable for the reference layer 160 include NiFe, NiFeCo, CoFe, CrO2, Fe3O4,, amorphous ferromagnetic alloys (e.g., CoZrNb and CoFeB), and other materials.

An exemplary process for making the exemplary memory structure 200 will be described in Section IV below.

Figure 2B:
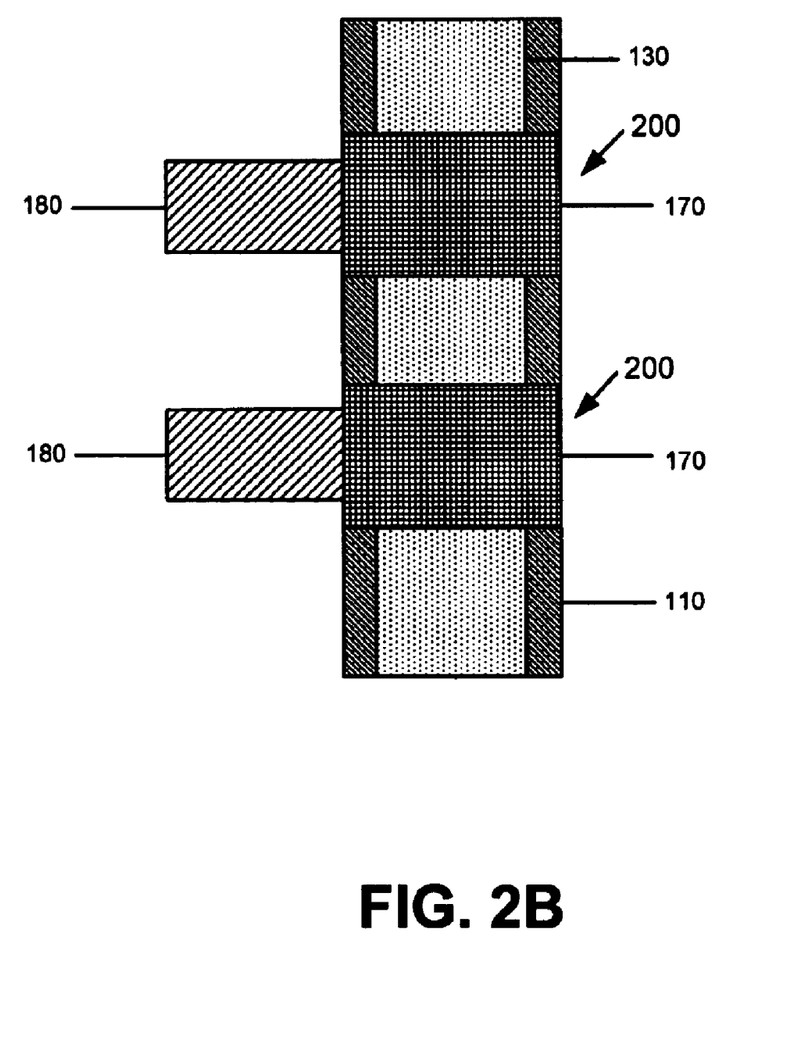
FIG. 2B illustrates the plan view of an array of the exemplary thermally-assisted magnetic memory structure of FIG. 2A.

B. An Exemplary Plan View of An Exemplary Array of the Second Thermally-Assisted Magnetic Memory Structure FIG. 2B illustrates a plan view of an exemplary array of the thermally-assisted magnetic memory structure 200 of FIG. 2A. In particular, memory structures 200 as illustrated in FIG. 2B are representative of the exemplary embodiment described above from a different viewpoint. Each exemplary memory structure 200 includes a memory cell 170 (which includes a data layer 140 (hidden from view), a spacer layer 150 (hidden from view), and a reference layer 160), a thermally resistive region 130 (which may comprise air, a vacuum, an insulator, or a combination thereof), a first conductor 120 (hidden from view) cladded by the cladding 110 along a first axis, and a second conductor 180 along another axis orthogonal to the axis of the first conductor 120. In another exemplary implementation (not shown), the cladding 110 may be covered by the spacer layer 150 and will be hidden from view.

IV. An Exemplary Process for Making the Exemplary Thermally-Assisted Magnetic Memory Structure of FIG. 1A FIGS. 3A–3K illustrate an exemplary process for manufacturing the exemplary thermally-assisted magnetic memory structure as shown in FIG. 1A.

FIGS. 3A–3D illustrates an exemplary Damascene process known in the art.

Figure 3A:
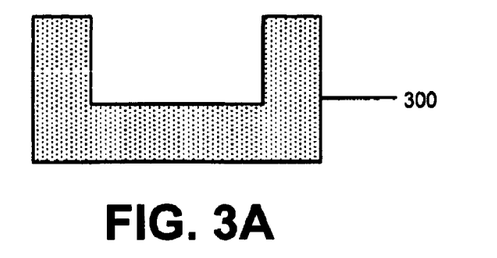
FIGS. 3A–3K illustrate an exemplary process for making the exemplary magnetic memory structure of FIG. 1A.
Figure 3B:
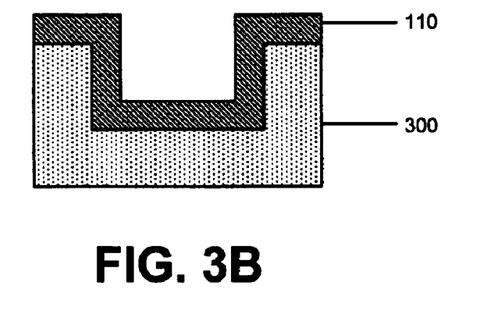

In FIG. 3A, a trench is etched, for example, in dielectric material 300, by a dry or wet etch known in the art. In FIG. 3B, a layer of cladding material 110 is formed in the trench in accordance with methods known in the art. For example, the cladding material 110 may be formed using electroplating, sputtering or other suitable deposition process. In an exemplary implementation, the layer of cladding material 110 will be etched later to form the cladding 110 of FIG. 1A.

Figure 3C:
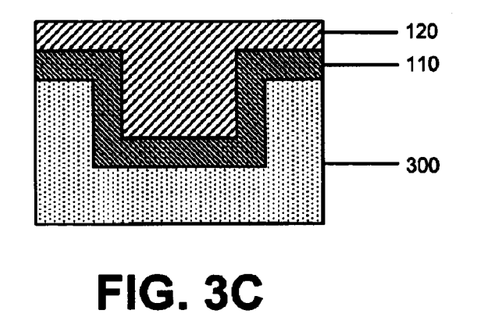

In FIG. 3C, a layer of conducting material 120 is formed on top of the cladding material 110 in accordance with methods known in the art. For example, the conducting material 120 may be formed using electroplating, sputtering or other suitable deposition process. In an exemplary implementation, the conducting material 120 will be etched later to form the first conductor 120 of FIG. 1A.

Figure 3D:
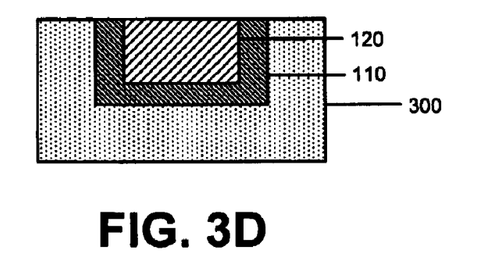

In FIG. 3D, the conducting material 120 and the cladding material 110 are planarized by a planarizing process such as chemical mechanical planarization (CMP) to form the first conductor 120 and the cladding 110 of FIG. 1A respectively.

Figure 3E:
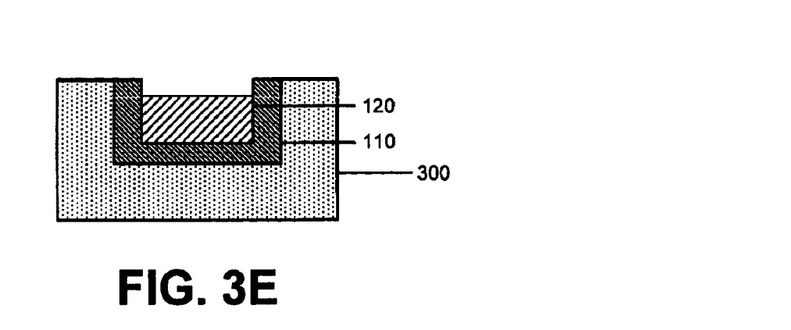

In FIG. 3E, a top portion of the first conductor 120 is etched to form a trench surrounded by the cladding 110. In an exemplary implementation, the first conductor 120 is etched by ion etching and/or other techniques known in the art.

Figure 3F:
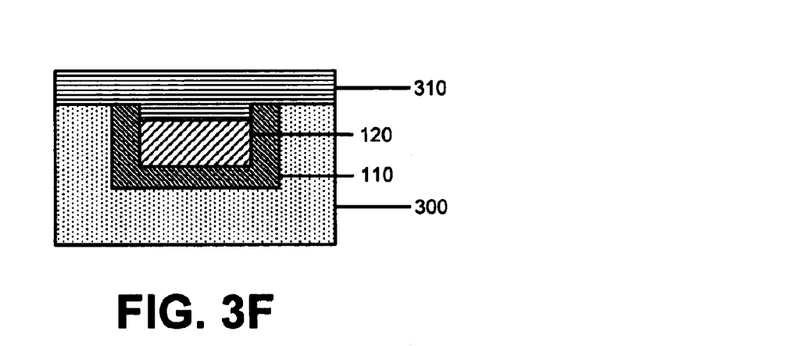

In FIG. 3F, a sacrificial layer 310 is formed on top of the structure, filling the trench created in the previous step. Exemplary materials for the sacrificial layer 310 include, without limitation, one or more of polymer, metal, oxide, etc. The sacrificial layer 310 should be selected such that it may be removed in a later step (described below) without materially affecting other layers in the exemplary magnetic memory structure. In an exemplary implementation, the sacrificial layer 310 is formed by deposition and/or other techniques known in the art.

Figure 3G:
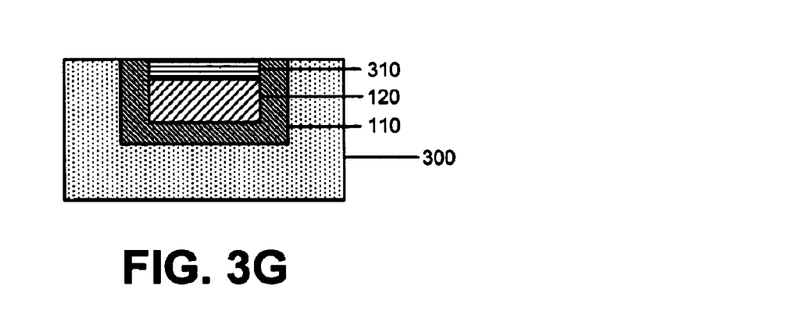

In FIG. 3G, the sacrificial layer 310 is planarized by a planarizing process such as chemical mechanical planarization (CMP) so that at least a portion of the cladding 110 is exposed.

Figure 3H:
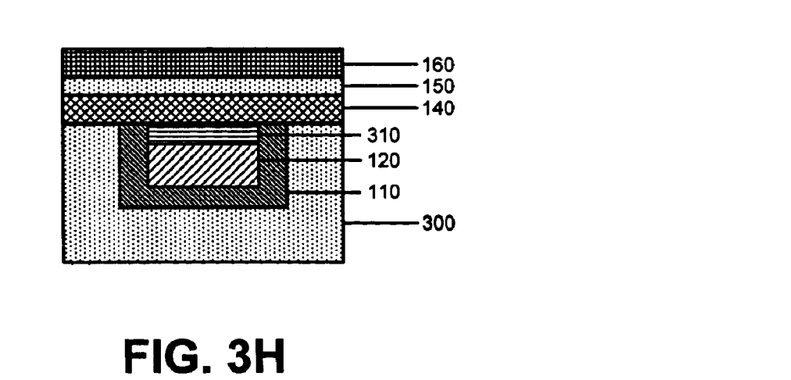
Figure 3I:
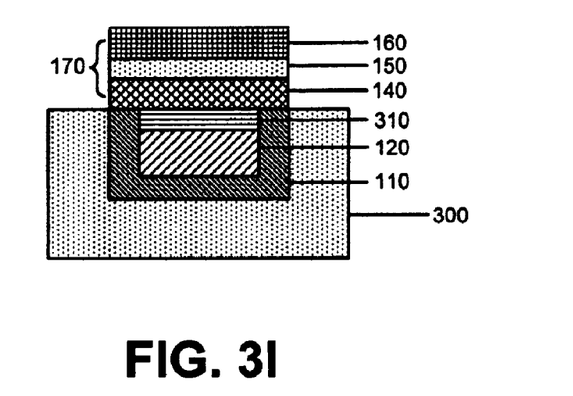

In FIG. 3H, a data layer 140, a spacer layer 150, and a reference layer 160 are formed on the cladding 110 and the remaining sacrificial layer 310. These data, spacer, and reference layers may be formed by deposition and/or other techniques known in the art (e.g., via sputtering, evaporation, chemical vapor deposition, atomic layer deposition (ALD), and/or other known techniques). In FIG. 3I, the data layer 140, spacer layer 150, and reference layer 160 are patterned by patterning processes known in the art to form the memory cell 170. In an exemplary implementation, the memory cell 170 makes electrical contact with at least a portion of the cladding 110 but not the first conductor 120 because the remaining sacrificial layer 310 separates the memory cell 170 from the first conductor 120. One skilled in the art will recognize that the memory cell 170 as shown is merely illustrative. Other configurations can also be implemented with various exemplary embodiments described herein in accordance with design choice. For example, one or more layers of the memory cell 170 may be made smaller or larger and/or thicker or thinner, one or more layers of the memory cell 170 may have a different shape with respect to each other, the memory cell 170 may make contact with just part of the exposed cladding 110, the memory cell 170 may have additional layers, the memory cell 170 may be bottom-pinned, etc.

Figure 3J:
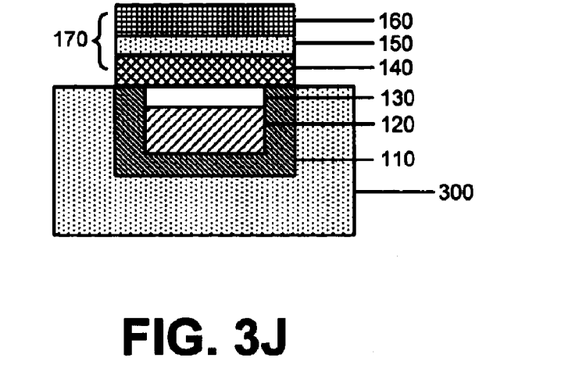

In FIG. 3J, the remaining sacrificial layer 310 under the memory cell 170 and above the first conductor 120 is removed to form a thermally resistive region 130. In an exemplary implementation, the remaining sacrificial layer 310 may be removed by etching (either wet etching or dry etching) techniques known in the art. For example, when using wet etching, one may use a chemical that preferentially etches the remaining sacrificial layer 310 but does not materially etch other layers in the exemplary magnetic memory structure. In another exemplary implementation, if the sacrificial layer 310 comprises one or more insulating materials, then some or all of the remaining sacrificial layer 310 may not be removed, as shown in FIG. 3I.

Figure 3K:
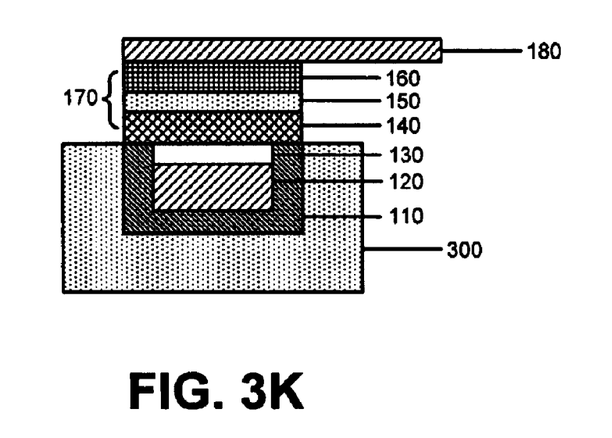

In FIG. 3K, a second conductor 180 is formed on top of the memory cell 170 by deposition and patterning techniques known in the art.

In the exemplary magnetic memory structure shown in FIG. 3K, the memory cell 170 is thermally isolated from the first conductor 120 by the thermally resistive region 130. As a result, when the memory cell 170 is heated (e.g., by a voltage pulse supplied by a heater line, such as the second conductor 180), the memory cell 170 will be able to reach a higher temperature than if the memory cell 170 were making relatively more thermal contact with the first conductor 120. Electrical contact between the memory cell 170 and the first conductor 120 is provided by the cladding 110 which contacts only a small surface area of the memory cell 170 to minimize heat dissipation. In addition, the cladding 110 may act as a flux guide to capture any magnetic fields generated by currents running through the first conductor 110, thereby, reducing the required switching current to write the memory cell 170.

The manufacturing steps illustrated above are merely exemplary. Those skilled in the art will appreciate that other manufacturing steps may be used in accordance with the requirements of a particular implementation. For example, the various layers as illustrated in FIGS. 3A–3K may be formed in accordance with other manufacturing sequences (e.g., the reference layer 160 may be formed first in a bottom-pinned memory structure, the remaining sacrificial layer 310 under the memory cell 170 can be removed after the second conductor 180 is formed, etc.), one or more layers may be formed at the same time, one or more layers of different materials may be combined to form a single layer (e.g., a data layer), additional layers (e.g., additional conductors) may be formed near the memory cell 170, etc. One skilled in the art will also recognize that the various thermal isolation embodiments discussed herein may be applied to other conductors near the memory cell 170, such as the second conductor 180, depending on design choice.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 150 may be a non-magnetic conducting layer for constructing a GMR memory cell.

V. An Exemplary Process for Making the Exemplary Thermally-Assisted Magnetic Memory Structure of FIG. 2A FIGS. 4A–4L illustrate an exemplary process for manufacturing the exemplary thermally-assisted magnetic memory structure as shown in FIG. 2A.

FIGS. 4A–4G illustrates an exemplary process similar to the description provided in Section VI above for FIGS. 3A–3G.

Figure 4A:
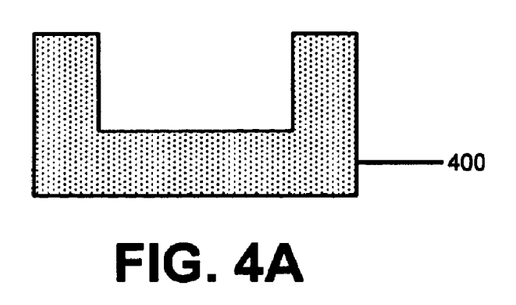
FIGS. 4A–4L illustrate an exemplary process for making the improved magnetic memory structure of FIG. 2A.
Figure 4B:
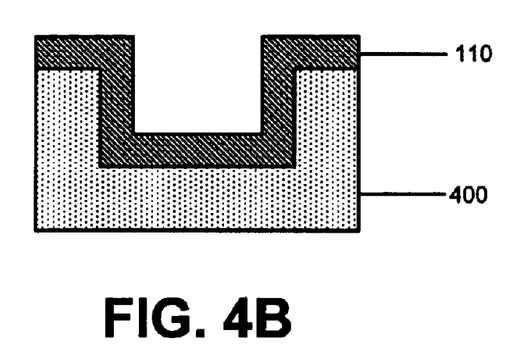
Figure 4C:
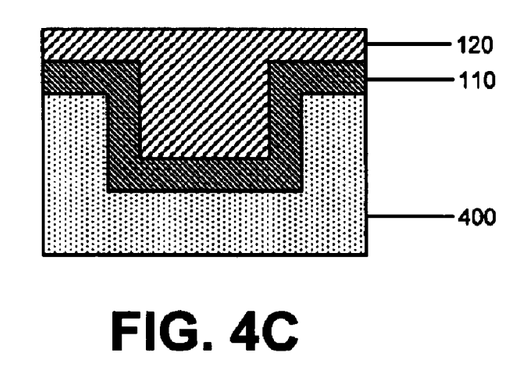
Figure 4D:
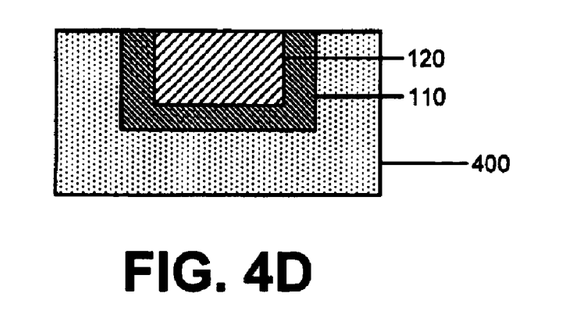
Figure 4E:
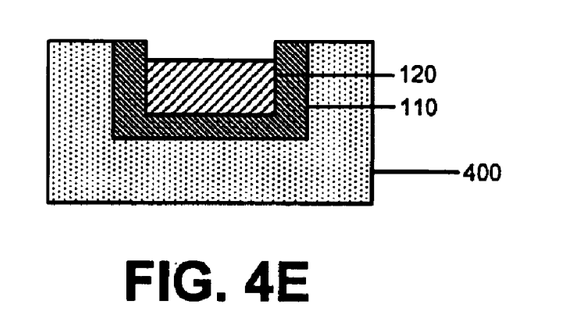
Figure 4F:
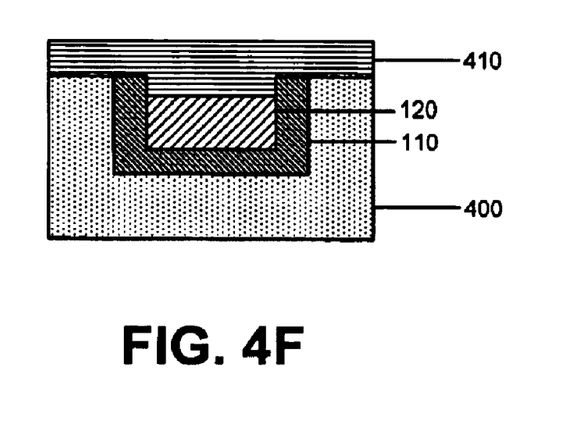
Figure 4G:
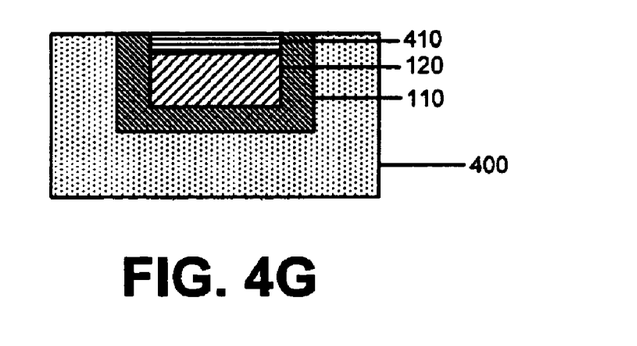
Figure 4H:
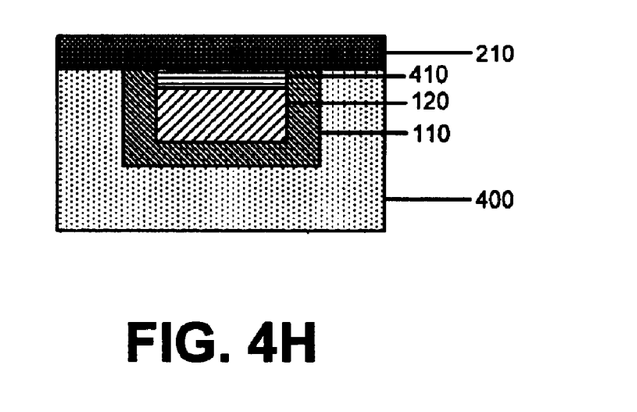

In FIG. 4H, an insulating layer 210 is formed by deposition and/or other techniques known in the art. In an exemplary implementation, the insulating layer comprises dielectric material.

Figure 4I:
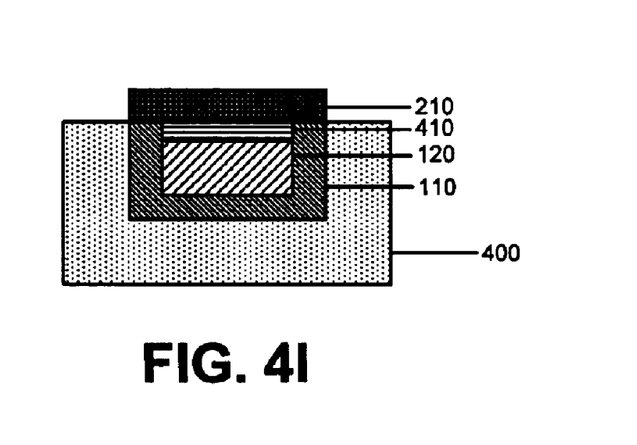

In FIG. 4L the insulating layer 210 is optionally patterned by patterning processes known in the art. In an exemplary implementation, the patterned insulating layer 210 covers the remaining sacrificial layer 410 and at least a portion of the cladding 110. The insulating layer 210 does not have to be patterned by a separate patterning process as shown in FIG. 4I. For example, the insulating layer 210 may be patterned at the same time the second conductor 180 is being patterned (see FIG. 4J) and/or when one or more other layers (not shown) in the memory structure 200 are patterned. Further, the insulating layer 210 does not have to be patterned to the same dimensions as the memory cell 170. For example, the insulating layer 210 may be wider than the memory cell 170. In an exemplary implementation, where the thermally resistive region 130 comprises an insulating material, the insulating layer 210 may remain unpatterned.

Figure 4J:
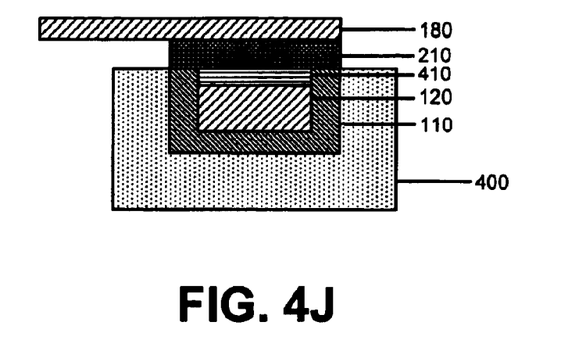

In FIG. 4J, a second conductor 180 is formed on top of the patterned insulating layer 210 by deposition and patterning techniques known in the art.

Figure 4K:
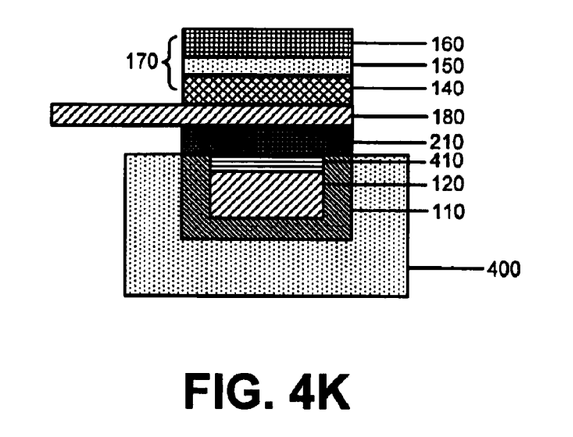

In FIG. 4K, a memory cell 170 comprising a data layer 140, a spacer layer 150, and a reference layer 160 is formed on the second conductor 180. These layers may be formed by deposition and/or other techniques known in the art (e.g., via sputtering, evaporation, chemical vapor deposition, atomic layer deposition (ALD), and/or other known techniques) and patterned by patterning processes known in the art. In an exemplary implementation, the memory cell 170 makes electrical contact with the second conductor 180. One skilled in the art will recognize that the memory cell 170 as shown is merely illustrative. Other configurations can also be implemented with various exemplary embodiments described herein in accordance with design choice. For example, one or more layers of the memory cell 170 may be made smaller or larger and/or thicker or thinner, one or more layers of the memory cell 170 may have a different shape with respect to each other, the memory cell 170 may have additional layers, the memory cell 170 may be bottom-pinned, etc.

Figure 4L:
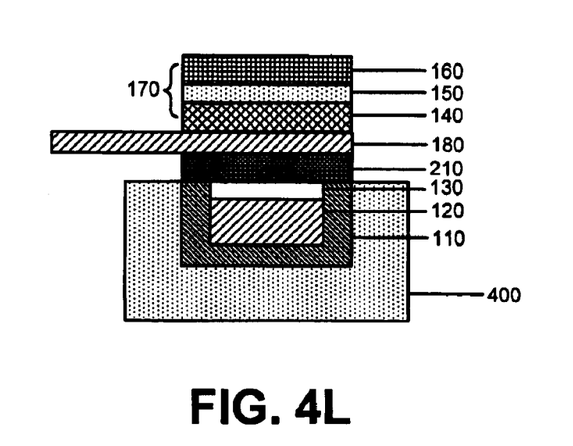

In FIG. 4L, the remaining sacrificial layer 410 under the patterned insulating layer 210 and above the first conductor 120 is removed to form a thermally resistive region 130. In an exemplary implementation, the sacrificial layer 410 may be removed by etching (either wet etching or dry etching) techniques known in the art. For example, when using wet etching, one may use a chemical that preferentially etches the remaining sacrificial layer 410 but does not materially etch other layers in the exemplary magnetic memory structure. In another exemplary implementation, if the sacrificial layer 410 comprises one or more insulating materials, then some or all of the remaining sacrificial layer 410 may not be removed.

In the exemplary magnetic memory structure shown in FIG. 4L, the memory cell 170 is thermally and electrically isolated from the first conductor 120 by the insulating layer 210 and the thermally resistive region 130. As a result, when the memory cell 170 is heated (e.g., by a voltage pulse supplied by a heater line), the memory cell 170 will be able to reach a higher temperature.

In the exemplary implementation shown in FIG. 4L, the memory cell 170 does not make electrical contact with the first conductor 120. Thus, other conductors (not shown) may be implemented near the memory cell 170 to provide selectivity during read/write operations. One skilled in the art will also recognize that the various thermal isolation embodiments discussed herein may be applied to other conductors near the memory cell 170, such as the second conductor 180, depending on design choice.

The manufacturing steps illustrated above are merely exemplary. Those skilled in the art will appreciate that other manufacturing steps may be used in accordance with the requirements of a particular implementation. For example, the various layers as illustrated in FIGS. 4A–4L may be formed in accordance with other manufacturing sequences (e.g., the reference layer 160 may be formed first in a bottom-pinned memory structure, the remaining sacrificial layer 410 under the memory cell 170 can be removed before the second conductor 180 is formed, etc.), one or more layers may be formed at the same time, one or more layers of different materials may be combined to form a single layer (e.g., a data layer), additional layers (e.g., additional conductors) may be formed near the memory cell 170, etc.

Further, the TMR memory cell illustrated above is merely exemplary. Those skilled in the art will appreciate that other types of memory cells (e.g., GMR memory cells, etc.) may be constructed according to the requirements of a particular implementation. For example, the spacer layer 150 may be a non-magnetic conducting layer for constructing a GMR memory cell.

VI. An Exemplary Process for Creating a Thermally Resistive Region

Figure 5A:
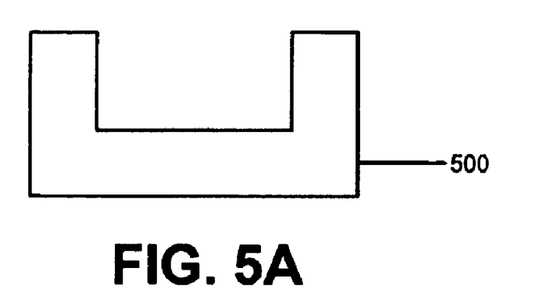
FIGS. 5A–5C illustrate an exemplary process for creating a thermally resistive region in the exemplary magnetic memory structures.
Figure 5B:
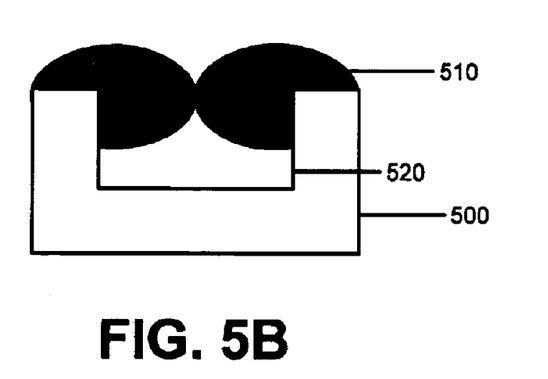
Figure 5C:
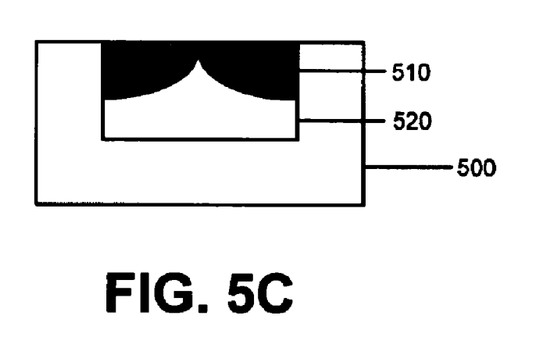

One skilled in the art will recognize that the thermally resistive region 130 shown in FIGS. 1A and 2A can also be created by other processes than those described in Sections VI and V above. For example, FIGS. 5A–5C illustrate another exemplary process for creating a thermally resistive region. In particular, FIGS. 5A–5C illustrate a process for creating a thermally resistive region that at least partially comprises air or a vacuum.

In FIG. 5A, a trench is formed in a substrate 500 by etching and/or other techniques known in the art.

In FIG. 5B, a high angle of incidence deposition technique known in the art is implemented to deposit a layer of material 510, such as dielectric material, that preferentially coats the sidewalls of the trench. The angle of incidence is the angle between the incoming atoms and the substrate normal. Eventually, the deposited material 510 forming on opposing sidewalls may meet, creating an encapsulated thermally resistive region 520 underneath the deposited material 510.

In FIG. 5C, the deposited material 510 is planarized by techniques known in the art.

The manufacturing steps illustrated above are merely exemplary. Those skilled in the art will appreciate that other manufacturing steps may be used in accordance with the requirements of a particular implementation. ps VII. Conclusion The various thermal isolation embodiments discussed herein are not limited to magnetic memory structures. For example, these embodiments may be applied to one or more conductors in a non-magnetic memory structure, including a phase-change memory structure, or still other memory structures, depending on design choice.

The foregoing examples illustrate certain exemplary embodiments from which other embodiments, variations, and modifications will be apparent to those skilled in the art. The inventions should therefore not be limited to the particular embodiments discussed above, but rather are defined by the claims.

What is claimed is:

1. A thermally-assisted magnetic memory structure, comprising:
   a first conductor substantially surrounded by a cladding;
   a memory cell being thermally isolated from said first conductor by a thermally resistive region; and
   a second conductor electrically contacting said memory cell.

2. The magnetic memory structure of claim 1, wherein said thermally resistive region comprises air.

3. The magnetic memory structure of claim 1, wherein said thermally resistive region forms a vacuum.

4. The magnetic memory structure of claim 1, wherein said thermally resistive region comprises an insulator.

5. The magnetic memory structure of claim 1, wherein said thermally resistive region is between said first conductor and said cladding.

6. The magnetic memory structure of claim 1, wherein said memory cell contacts at least a portion of said cladding.

7. The magnetic memory structure of claim 1, wherein said cladding comprises a material having a low thermal conductivity.

8. The magnetic memory structure of claim 1, wherein said cladding comprises an amorphous metal alloy.

9. The magnetic memory structure of claim 1, wherein said cladding comprises a ferromagnetic material.

10. The magnetic memory structure of claim 9, wherein said cladding acts as a magnetic flux guide for magnetic fields generated by current flowing in said first conductor.

11. The magnetic memory structure of claim 10, wherein said cladding width is selected to achieve a desired balance between: (1) non-saturation during write operations; and (2) minimum heat dissipation.

12. The magnetic memory structure of claim 1, wherein said cladding substantially surrounds three sides of the first conductor.

13. The magnetic memory structure of claim 1, wherein said memory cell comprises a ferromagnetic data layer, a spacer layer, and a ferromagnetic reference layer.

14. The magnetic memory structure of claim 1, wherein said second conductor acts as a heater line to provide heat to said memory cell.

15. The magnetic memory structure of claim 1, wherein said second conductor is a smaller heat sink than said first conductor.

16. A method for making a thermally-assisted magnetic memory structure, comprising:
   forming a first conductor substantially surrounded by a cladding;
   forming a second conductor; and
   forming a memory cell, said memory cell:
      electrically contacting said second conductor; and
      being thermally isolated from said first conductor by a thermally resistive region.

17. The method of claim 16, wherein said cladding comprises a material having a low thermal conductivity.

18. The method of claim 16, wherein said cladding substantially surrounds three sides of said first conductor.

19. The method of claim 16, further comprising:
   forming a sacrificial layer above said first conductor and said cladding;
   planarizing said sacrificial layer until a portion of said cladding is exposed;
   forming an additional layer in said magnetic memory structure above said sacrificial layer; and
   removing at least a portion of said sacrificial layer.

20. The method of claim 19, wherein said sacrificial layer comprises a material having a different etching selectivity than at least one other layer in said magnetic memory structure.

21. The method of claim 19, wherein said sacrificial layer comprises a polymer.

22. The method of claim 19, wherein said sacrificial layer comprises a metal.

23. The method of claim 19, wherein said sacrificial layer comprises an oxide.

24. The method of claim 16, further comprising:
   depositing a material on at least two sidewalls of said cladding until a portion of said material on said sidewalls meets and a thermally resistive region is encapsulated below said material; and
   planarizing said material until a portion of said cladding is exposed.

25. The method of claim 24, wherein said depositing comprises implementing a high angle of incidence deposition technique.

26. The method of 16, wherein said memory cell contacts at least a portion of said cladding.

27. The method of claim 16, further comprising:
   forming an insulating layer between said thermally resistive region and said second conductor.

28. A nonvolatile memory array comprising a plurality of thermally-assisted magnetic memory structures, each of said magnetic memory structures being made by a process comprising:
   forming a first conductor substantially surrounded by a cladding;
   forming a second conductor; and
   forming a memory cell, said memory cell:
      electrically contacting said second conductor; and
      being thermally isolated from said first conductor by a thermally resistive region.

29. A computer product comprising a microprocessor interfacing with an array of thermally-assisted magnetic memory structure, each of said thermally-assisted magnetic memory structure comprising:
   a first conductor substantially surrounded by a cladding;
   a memory cell being thermally isolated from said first conductor by a thermally resistive region; and
   a second conductor electrically contacting said memory cell.

* * * * *